United States Patent
Sturm et al.

(10) Patent No.: US 7,090,890 B1
(45) Date of Patent: Aug. 15, 2006

(54) MODIFICATION OF POLYMER OPTOELECTRONIC PROPERTIES AFTER FILM FORMATION BY IMPURITY ADDITION OR REMOVAL

(75) Inventors: James C. Sturm, Princeton, NJ (US); Thomas R. Hebner, Allendale, NJ (US); Florian Pschenitzka, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/673,204

(22) PCT Filed: Apr. 12, 1999

(86) PCT No.: PCT/US99/07970

§ 371 (c)(1),
(2), (4) Date: Feb. 1, 2001

(87) PCT Pub. No.: WO99/53529

PCT Pub. Date: Oct. 21, 1999

Related U.S. Application Data

(60) Provisional application No. 60/081,492, filed on Apr. 13, 1998.

(51) Int. Cl.
*B05D 5/06* (2006.01)
*B05D 5/12* (2006.01)
*B05D 1/32* (2006.01)
*B05D 3/02* (2006.01)
*B05D 3/10* (2006.01)

(52) U.S. Cl. .......... 427/68; 427/66; 427/272; 427/273; 427/282; 427/335; 427/336; 427/352

(58) Field of Classification Search .......... 427/66, 427/68, 272, 273, 282, 335, 336, 352
See application file for complete search history.

(56) References Cited

U.S. PATENT DOCUMENTS 3,614,225 A * 10/1971 Dinella et al. ............... 355/85

(Continued)

FOREIGN PATENT DOCUMENTS

GB   2 330 451   4/1999

(Continued)

OTHER PUBLICATIONS

Pschenitzka, et al., "Three-Color Organic Light-Emitting Diodes Patterned by Masked Dye Diffusion," Appl. Phys. Lett., vol. 74, No. 13, Mar. 29, 1999, pp. 1913-1915.

(Continued)

*Primary Examiner*—Michael Cleveland
(74) *Attorney, Agent, or Firm*—Kenyon & Kenyon LLP

(57) ABSTRACT

The methods of this invention involve modification of the properties of an organic film after it has been deposited by either adding new components into it from its top or bottom surface, or by causing components to leave the film from its top or bottom surface. In the examples of these methods, the emitting color of light-emitting diodes are modified based on doped polymers by locally introducing dopants causing different color emission into the film by local application of a solution containing the desired dopant to the film surface (by ink jet printing, screen printing, local droplet application, etc.). This overcomes difficulties encountered with the direct patterning of three separately formed organic layers (each which uniformly coats an entire surface when formed) into regions for separate R, G, and B devices due to the sensitivities of the organic materials to chemicals typically used with conventional patterning technologies. Alternatively, dopants may be introduced in an organic film by diffusion from one layer into the film. Alternatively, dopants may be selectively removed from a film with solvents, etc.

16 Claims, 14 Drawing Sheets

U.S. PATENT DOCUMENTS

| | | | | |
|---|---|---|---|---|
| 3,615,943 | A | | 10/1971 | Genser ..................... 148/188 |
| 3,986,823 | A | * | 10/1976 | Mayer ........................... 8/471 |
| 4,104,091 | A | | 8/1978 | Evans, Jr. et al. .......... 148/188 |
| 4,218,362 | A | * | 8/1980 | Honjo et al. ................ 524/409 |
| 4,243,694 | A | * | 1/1981 | Mansukhani ................ 427/466 |
| 4,251,285 | A | | 2/1981 | Yoldas et al. ............... 136/256 |
| 4,332,879 | A | * | 6/1982 | Pastor et al. ............. 430/272.1 |
| 4,736,704 | A | | 4/1988 | Henninger |
| 4,833,123 | A | * | 5/1989 | Hashimoto et al. ......... 503/227 |
| 4,914,451 | A | * | 4/1990 | Morris et al. ................ 347/105 |
| 4,929,666 | A | | 5/1990 | Schmidt et al. |
| 4,971,858 | A | * | 11/1990 | Yamano et al. ............ 428/32.5 |
| 5,004,956 | A | * | 4/1991 | Kun et al. ..................... 345/76 |
| 5,006,624 | A | | 4/1991 | Schmidt et al. |
| 5,055,444 | A | * | 10/1991 | Kaszczuk ................... 503/227 |
| 5,116,781 | A | | 5/1992 | Agostinelli et al. ......... 437/168 |
| 5,132,248 | A | | 7/1992 | Drummond et al. |
| 5,250,439 | A | | 10/1993 | Musho et al. |
| 5,312,654 | A | | 5/1994 | Arimatsu et al. |
| 5,385,848 | A | | 1/1995 | Grimmer |
| 5,398,051 | A | * | 3/1995 | Fukui et al. ................. 347/213 |
| 5,422,230 | A | * | 6/1995 | Boggs et al. ................ 430/338 |
| 5,495,250 | A | | 2/1996 | Ghaem et al. |
| 5,521,047 | A | * | 5/1996 | Yuh et al. .................... 430/134 |
| 5,538,548 | A | * | 7/1996 | Yamazaki ................... 524/386 |
| 5,551,973 | A | * | 9/1996 | Oliver et al. ............. 106/31.25 |
| 5,583,349 | A | | 12/1996 | Norman et al. ............... 257/88 |
| 5,596,208 | A | | 1/1997 | Dodabalapur et al. |
| 5,609,943 | A | | 3/1997 | DeKoven et al. |
| 5,640,180 | A | * | 6/1997 | Hale et al. ...................... 347/3 |
| 5,643,356 | A | * | 7/1997 | Nohr et al. ............... 106/31.49 |
| 5,673,077 | A | * | 9/1997 | Kawakami et al. ......... 347/183 |
| 5,681,756 | A | | 10/1997 | Norman et al. ................. 437/1 |
| 5,688,551 | A | * | 11/1997 | Littman et al. ............... 427/64 |
| 5,693,962 | A | | 12/1997 | Shi et al. ....................... 257/89 |
| 5,719,467 | A | * | 2/1998 | Antoniadis et al. ......... 313/506 |
| 5,739,545 | A | | 4/1998 | Guha et al. |
| 5,777,707 | A | | 7/1998 | Masaki et al. |
| 5,801,884 | A | * | 9/1998 | Sato et al. ................... 359/620 |
| 5,866,922 | A | | 2/1999 | Huang et al. .................. 257/93 |
| 5,880,176 | A | | 3/1999 | Kamoto et al. |
| 5,895,692 | A | * | 4/1999 | Shirasaki et al. ............ 427/557 |
| 5,919,532 | A | | 7/1999 | Sato et al. |
| 5,953,587 | A | | 9/1999 | Forrest et al. ................ 438/99 |
| 5,972,052 | A | | 10/1999 | Kobayashi et al. ........ 29/25.03 |
| 5,972,457 | A | * | 10/1999 | Matsuishi et al. .......... 428/64.1 |
| 6,013,982 | A | | 1/2000 | Thompson et al. |
| 6,054,223 | A | | 4/2000 | Tsuchiya et al. .......... 428/32.27 |
| 6,066,357 | A | * | 5/2000 | Tang et al. .................... 427/66 |
| 6,087,196 | A | | 7/2000 | Sturm et al. |
| 6,099,746 | A | * | 8/2000 | Kim ............................. 216/25 |
| 6,150,042 | A | * | 11/2000 | Tamano et al. ............. 428/690 |
| 6,329,111 | B1 | * | 12/2001 | Nojiri et al. ................... 430/25 |
| 6,575,800 | B1 | * | 6/2003 | Kobayashi et al. ......... 445/524 |
| 2002/0041926 | A1 | | 4/2002 | Miyashita et al. |

FOREIGN PATENT DOCUMENTS

| | | | |
|---|---|---|---|
| JP | 61-36276 | | 2/1986 |
| JP | 8-165448 | | 6/1996 |
| JP | 10-12377 | | 1/1998 |
| WO | 98/28946 | | 7/1998 |
| WO | WO99/12396 | * | 3/1999 |

OTHER PUBLICATIONS

J. Bharathan et al., "Polymer electroluminescent devices processed by inkjet printing: I. Polymer light-emitting logo", Applied Physics Letters, vol. 72, Issue 21, pp. 2660-2662, May 25, 1998.

S. Chang et al., "Dual-color polymer light-emitting pixels processed by hybrid inkjet printing", Applied Physics Letters, vol. 73, Issue 18, pp. 2561-2563, Nov. 2, 1998.

Garnier et al., "All-polymer field-effect transistor realized by printing techniques", Science, vol. 265, pp. 1684-1686, Sep. 16, 1994.

T.R. Hebner et al., "Ink-jet printing of doped polymers for organic light emitting devices", Applied Physics Letters, vol. 72, No. 5, pp. 519-521, Feb. 2, 1998.

T.R. Hebner et al., "Local tuning of organic light-emitting diode color by dye droplet application", Applied Physics Letters, vol. 73, No. 13, pp. 1775-1777, Sep 28, 1998.

J. Kido, et al., "White light-emitting organic electroluminescent devices using the poly(N-vinylcarbazole) emitter layer doped with three fluorescent dyes", Applied Physics Letters, vol. 64 (7), pp. 815-817, Feb. 14, 1994.

R.F. Service, "Patterning Electronics on the Cheap", Science, vol. 278, pp. 383-384, Oct. 17, 1997.

C. Wu, et al., "Efficient organic electroluminescent devices using single-layer doped polymer thin films with bipolar carrier transport abilities", IEEE Transactions of Electron Devices, vol. 44, No. 8, pp. 1269-1275, Aug. 1997.

Y. Yang et al., "Polymer light-emitting logos processed by the ink-jet printing technology", SPIE, vol. 3279, pp. 78-86, Jan. 1998.

* cited by examiner

C6 IN ACETONE → ← C6 IN TCE

C6 IN ACETONE → ← C6 IN TCE

LINES MADE BY
INK-JET PRINTING
OF DYE

MODIFICATION OF POLYMER OPTOELECTRONIC PROPERTIES AFTER FILM FORMATION BY IMPURITY ADDITION OR REMOVAL

This application is a national application under 35 U.S.C. § 371 based upon PCT/US99/07970, which was filed on Apr. 12, 1999, and claims priority to provisional application 60/081,492, filed on Apr. 13, 1998.

BACKGROUND OF THE INVENTION

1. Field of the Invention

The present invention relates to methods of making semiconductor devices using light emitting organic materials, and more specifically, to methods which involve the modification of the properties of an organic film after it has been deposited by either: (i) adding new components into the film from a top or bottom surface; or (ii) by causing components to leave the film from a top or bottom surface.

2. Related Art

Polymers and blends of polymers and small organic molecules have recently been extensively used to fabricate organic light emitting diodes and thin film transistors.

Organic films are typically deposited in thin film form for electrical and optoelectronic applications by uniformly coating a surface by spin-coating or other methods. Sometimes the final organic film itself is not directly formed, but a precursor is deposited which is converted to a polymer by a subsequent step, such as heating or exposure to UV light (e.g. PPV). It is also well known that adding various elements to the organic film can change its electrical and/or optical properties. These may include elements to change the conduction of electrical carriers (e.g. PBD for electron transportability), or dye centers to change the color of photo- and electro-luminescence (e.g. coumarin 6 in PVK). These extra elements are usually added to the original material before the final solid film is deposited. For example, these different groups could be bonded to a polymer chain before the polymer is deposited by spin coating, or may just be added as other polymers or individual smaller molecules to the solution containing the polymer before a thin film is formed. In either case all materials in the original solution become part of the final film.

The goal of fabricating full color flat panel displays has the potential to be reached using organic light emitting diodes (OLEDs). The difficulty with using this technology is that the current deposition techniques, such as spin-coating and evaporation, deposit blanket films. The film can be used to make devices of a single color. To achieve individual emitters of different color next to each other, such as red, green, and blue, the deposited blanket film must be typically etched into a pattern, as might be done by photolithography followed by etching. Then, this process has to be repeated for multiple layers to achieve full color (red, green and blue emitters). Etching of organic films and photoresist processing for lithography on organic films has proven to be technically very difficult and expensive. Therefore, instead of making a blanket film of one color, etching and making a blanket film of another color, it would be beneficial to make one blanket film and later locally change the properties of the film to emit different light colors. Thus, the need for etching would be removed.

Another approach is ink-jet printing local regions, but a problem associated with ink-jetting printing is that the dots printed do not have a uniform thickness.

Accordingly, what is desired, and has not heretofore been developed, is a method to modify the properties of a film after it has been formed, by introducing therein or removing impurities to modify the properties therefrom.

OBJECTS AND SUMMARY OF THE INVENTION

An object of the present invention is to provide a method for manufacturing optoelectronic organic films having locally modified areas.

Another object of the present invention is to provide an organic film with various regions of modified optoelectronic properties.

Still another object and advantage of the invention is to form an organic film with modified properties by applying dopants in desired places.

A further object and advantage of the invention is the provision of a method for forming an organic film with local modified areas by adding impurities to or removing impurities from the film.

Even another object of the invention is to provide a method for locally modifying properties of an organic film without the need for photolithography and etching of the organic film.

A still further object and advantage of the invention is the provision of a method for manufacturing a locally modified organic film with the need for contacting the surface of said film with solvents.

Even an additional object of the invention is to provide a process of forming a locally modified organic film wherein dopant is added to the film in an annealing process.

Yet an additional object of the present invention is to provide a process for transferring a dopant from one layer to another layer.

A further object of this invention is the provision of a process for transferring a dopant from one layer to another layer in a desired pattern.

The methods of this invention involve modification of the properties of an organic film after it has been deposited by either adding new components into it from its top or bottom surface, or by causing components to leave the film from its top or bottom surface. In the examples of these methods, the emitting color of light-emitting diodes are modified based on doped polymers by locally introducing dopants causing different color emission into the film by local application of a solution containing the desired dopant to the film surface (by ink jet printing, screen printing, local droplet application, etc.). This overcomes difficulties encountered with the direct patterning of three separately formed organic layers (each which uniformly coats an entire surface when formed) into regions for separate R, G, and B devices due to the sensitivities of the organic materials to chemicals typically used with conventional patterning technologies. Alternatively, dopants may be introduced in an organic film by diffusion from one layer into the film in local regions or by locally applying them directly into the organic film. Alternatively, dopants may be selectively removed from a film with solvents, etc.

Typically all of the active components are incorporated into the polymer when the polymer film is first formed, for example by spin coating it over a surface. In the present invention, the properties of the material are modified after a solid film has been formed by later introducing new species into the film from either its top or bottom surface, or removing impurities out through the top or bottom surface especially in a patterned arrangement. The method is especially attractive for the local modification of the photoluminescence and/or electroluminesence color of a thin film of the material, for example to create red, green, and blue light-emitting regions after a surface has been coated with a thin film of the material which is the same everywhere.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

The goal of fabricating full color flat panel displays has the potential to be reached using organic light emitting diodes (OLEDs). The difficulty with using this technology is that the current deposition techniques, such as spin-coating and evaporation, deposit blanket films. The film can be used to make devices of a single color. To achieve individual emitters of different color next to each other, such as red, green, and blue, the deposited blanket film must be typically etched into a pattern, as might be done by photolithography followed by etching. Then, this process has to be repeated for multiple layers to achieve full color (red, green and blue emitters). Etching of organic films and photoresist processing for lithography on organic films has proven to be technically very difficult and expensive. Therefore, instead of making a blanket film of one color, etching and making a blanket film of another color, it would be beneficial to make one blanket film and later locally change the properties of the film to emit different light colors. Thus, the need for etching would be removed.

The present invention, in a broad, general sense, relates to the application of an organic film and thereafter modifying local characteristics thereof by adding or removing components, i.e. dopants, dyes, etc., to or from the film to change the local characteristics of the film. Specifically, the invention relates to modifying the optoelectronic properties of an organic film by impurity or additional removal in a patterned fashion after application of the film. Even more specifically, the invention relates to modifying the emitting color of light-emitting diodes based on doped polymers by locally introducing dopants causing different color emission into an organic film by local application of solutions containing desired dopants to the film surface, i.e. by ink-jetting or screen printing. Alternatively, impurities contained within the film prior to application can be removed therefrom in desired patterns through various methods such as by application of solvents.

Figure 1A:
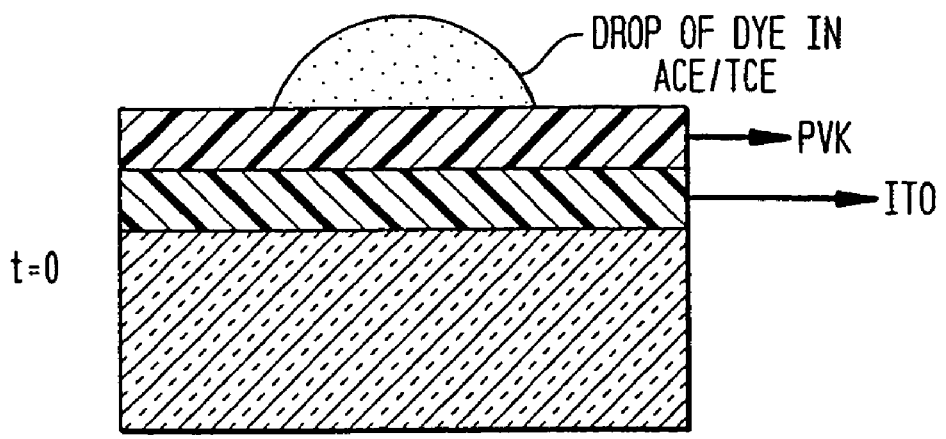
FIGS. 1a and 1b are diagrams of the application of dye on top of PVK film.
Figure 1B:
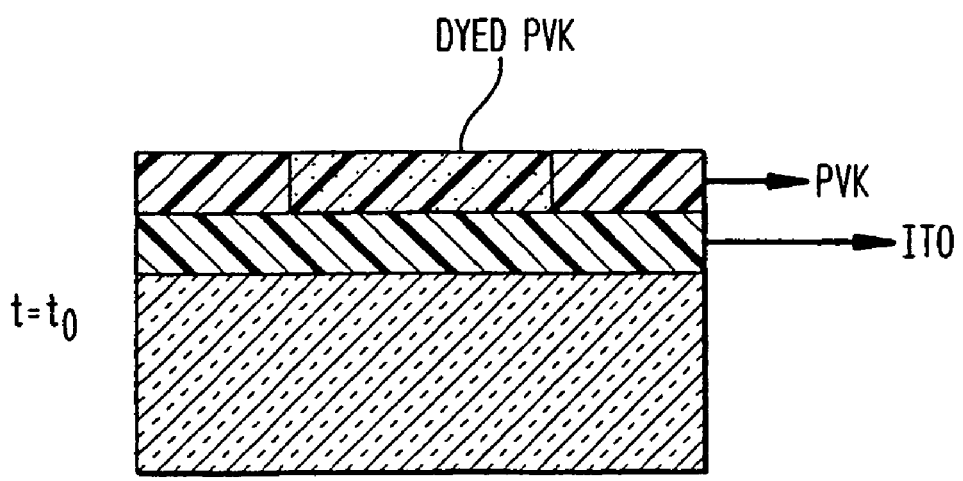

One way for achieving this result is to locally dye a poly(9-vinylcabazole) (PVK a hole transporting polymer) spun-on film, with green, red and blue dyes. The dyes would dissolve in acetone or trichloroethylene (TCE), solvents that do not dissolve PVK, and could be patterned on top of the PVK film using an ink-jet printer. As shown in FIGS. 1a and 1b, the dopants diffuse into the film and the solvent evaporates. Then metal cathodes could be patterned on top of the locally dyed regions, thus achieving full color integration.

Figure 2A:
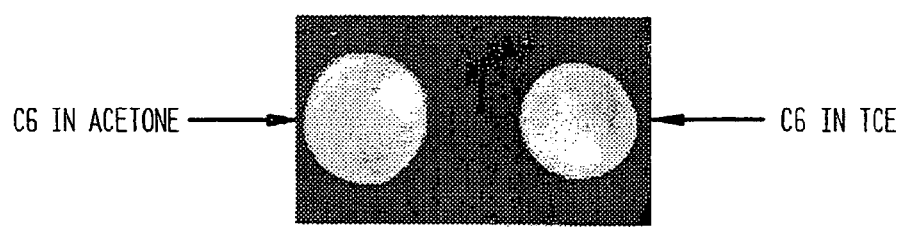
FIGS. 2a and 2b are diagrams of dye on PVK film under UV illumination.
Figure 2B:
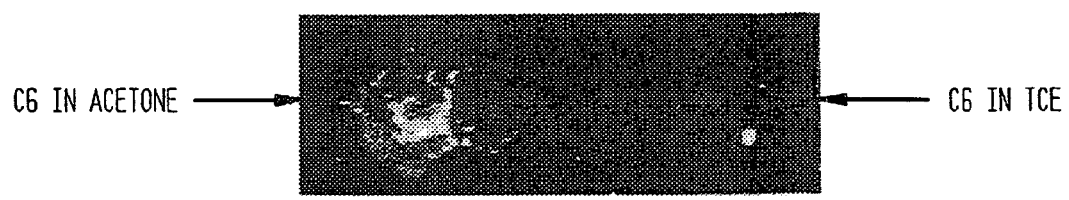

To verify this technique, droplets of coumarin 6 (C6, a green dye) dissolved in TCE and Acetone were placed onto a spun-on 1000 angstrom thick PVK film using a pipette and the solvents were given time to evaporate. FIG. 2a shows a picture of these drops taken from above with a UV lamp shining on them to excite fluorescence of the organic film. Under UV, they appear to be a greenish yellow color. These droplets were also placed onto glass where no diffusion occurs and the C6 remains on the surface, and the solvents were allowed to evaporate, as shown in FIG. 2b. Under UV lamp they appear to be a reddish color. This indicates that when the drops are placed onto a PVK film there is some interaction with the PVK, because when the PVK is present the dyed areas appear greenish-yellow, and when the PVK is not present the dye appears red. The interaction is the diffusion of the dye into PVK.

Figure 3:
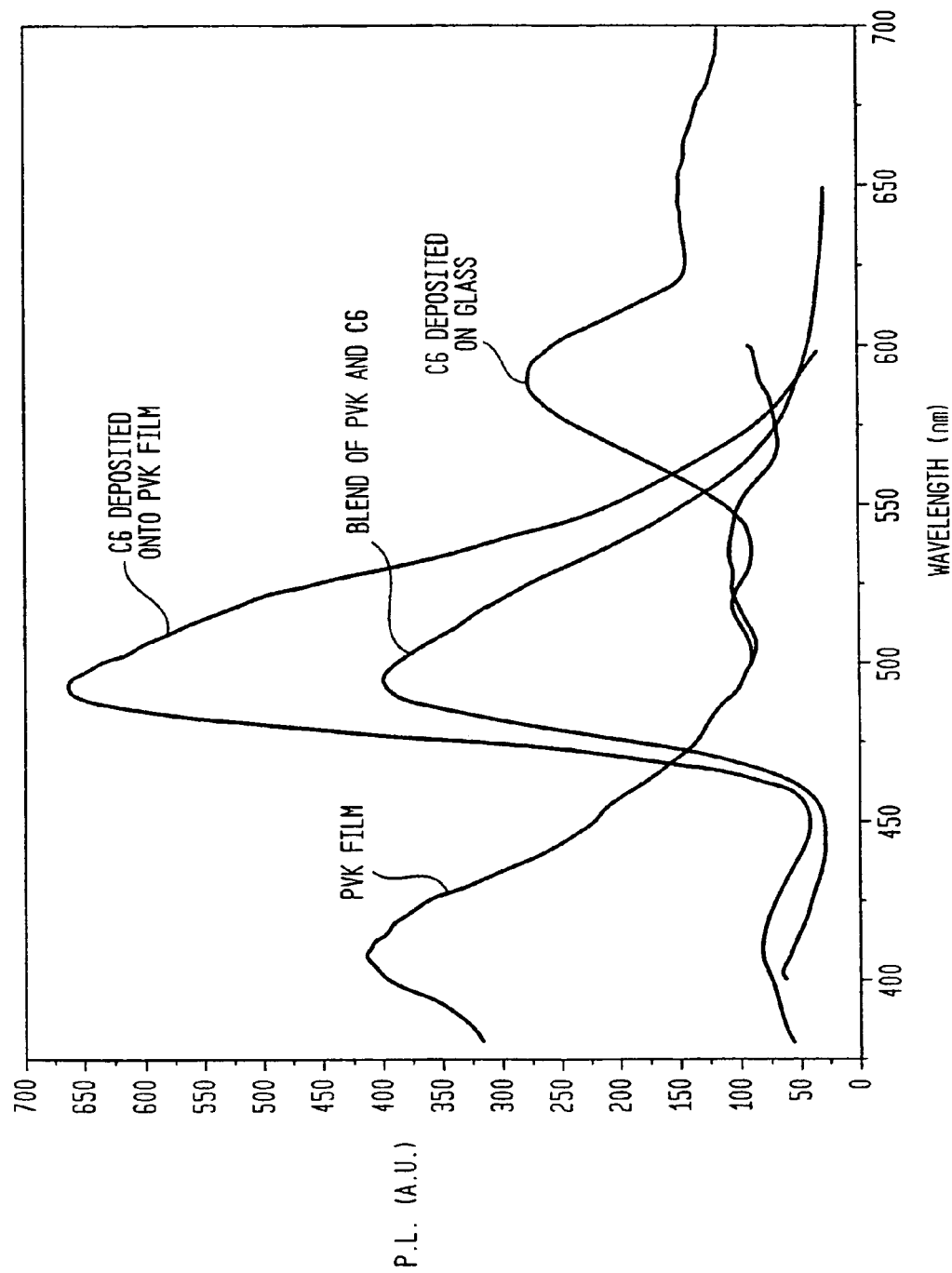
FIG. 3 is a plot of photoluminescence of materials used in FIGS. 1–2.

In order to state the above observations in a more quantitative way, a photoluminescence spectra was taken. FIG. 3 shows the PL spectra of a pure PVK film (peak at 410 nm), a PVK film locally dyed with C6 (peak at 490 nm), a blend film, where the PVK was dyed in solution with C6 (peak a 490 nm), and the dye on glass (peak at 580 nm). This provides evidence that not only does the dye interact with the PVK, but it interacts in such a way that the PL spectra is nearly identical to that of a blend film, which is known to be able to be made into a device. Therefore, the next step was to attempt to make a device using this locally dyeing procedure.

Figure 4A:
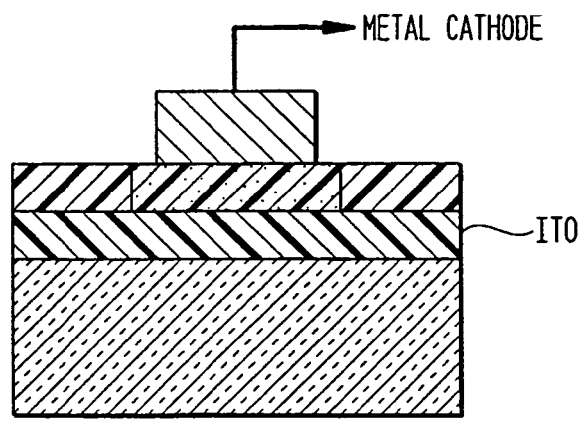
FIG. 4a is a diagram of a device and FIG. 4b is a plot of the electroluminsence spectra of PVK and C6.
Figure 4B:
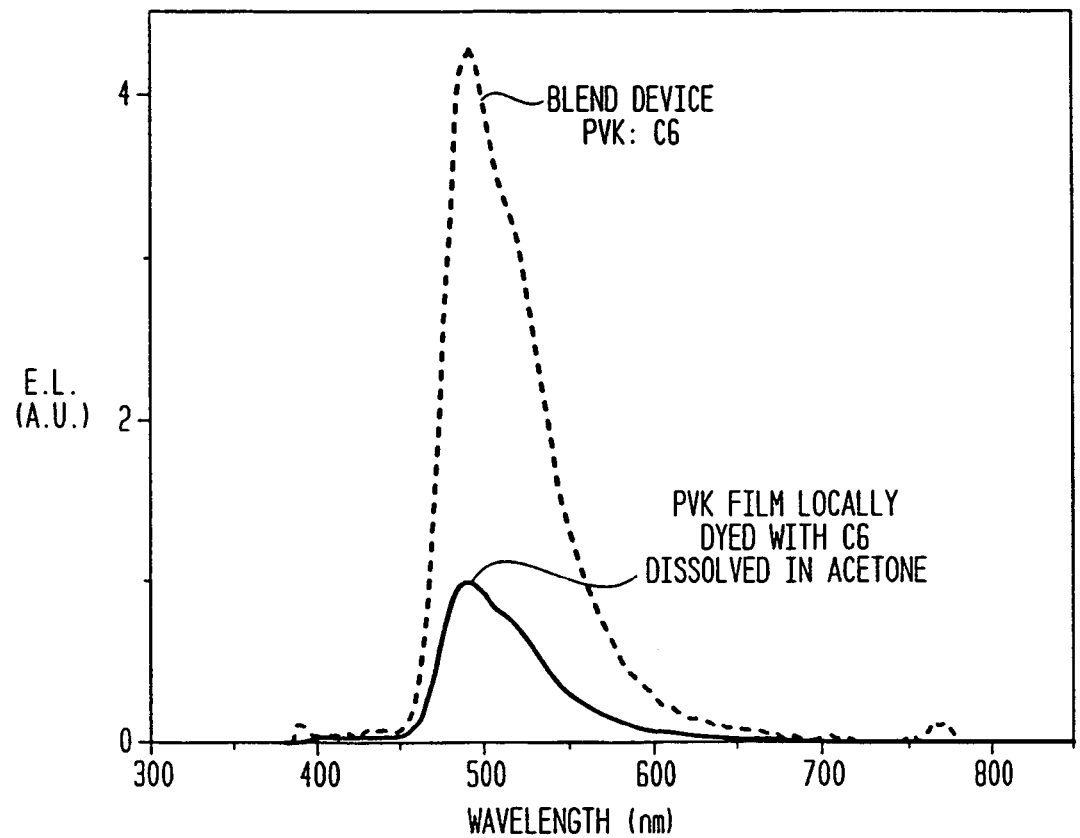

FIG. 4a shows the device structure, and FIG. 4b shows the electro-luminescence (EL) spectrum of the device and the EL of a blend device made by dissolving PVK and C6 in chloroform, spinning the film, and evaporating contacts. To make the locally dyed device, PVK dissolved in chloroform was spun onto glass coated with indium tin oxide (ITO, a transparent conductor). Next, a drop of C6 dissolved in acetone was dropped onto the surface, the sample was then spun again. Finally, a metal contact was evaporated on top of the dyed area. The EL spectra of the locally dyed device is seen to have the same 490 nm peak as the blend device Therefore, this shows that the dye not only interacts with the PVK, but it interacts in such a way that a device can be made which has a similar EL spectra to blend device.

Figure 5A:
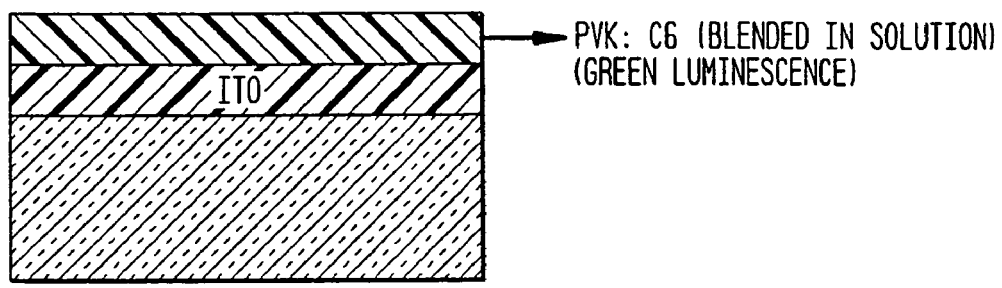
FIGS. 5a and 5b are diagrams of removal of local dye with acetone.
Figure 5B:
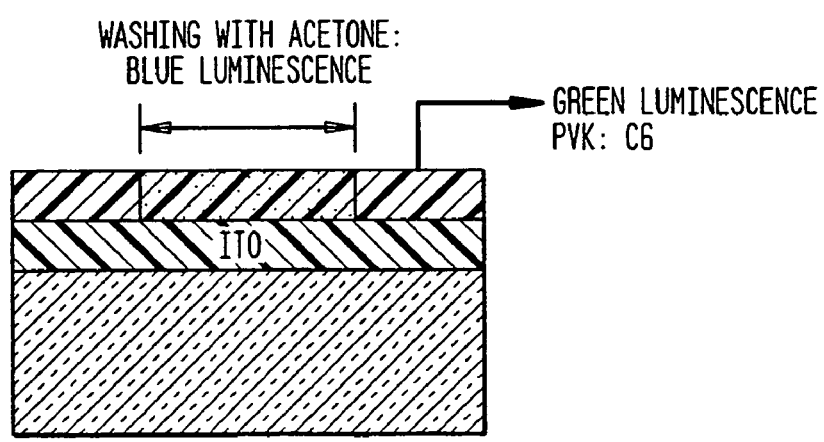

In order to further investigate this locally dyeing phenomenon, an experiment was set up to see if dye could be washed out of a blend film, which had been dyed in solution. FIGS. 5a and 5b shows a schematic of the experiment. First, PVK and C6 were dissolved in chloroform. Next, they were spun-on to an ITO coated glass substrate, forming a 1000 angstrom film. When this film was observed under a UV lamp, it appeared green. Next, a drop of acetone was dropped onto the surface. When a UV lamp was shone onto the sample, it was observed that where the drop of acetone had been, the sample was blue, and where it had not been, the sample was green. This indicates that the dye could be washed out of a blend film, which created a local area without dye. Therefore, two different color LEDs could be made on a substrate which had been locally washed.

Figure 6A:
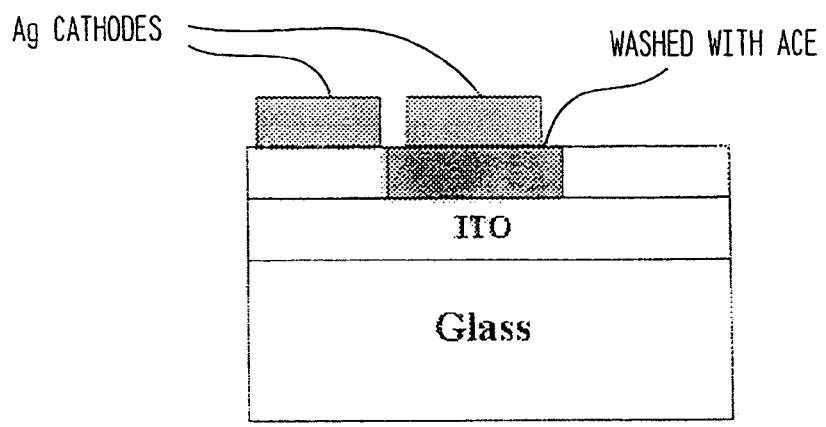
FIG. 6a is a diagram of a device and FIGS. 6b and 6c photographs of the device of FIG. 6a under UV illumination.
Figure 6B:
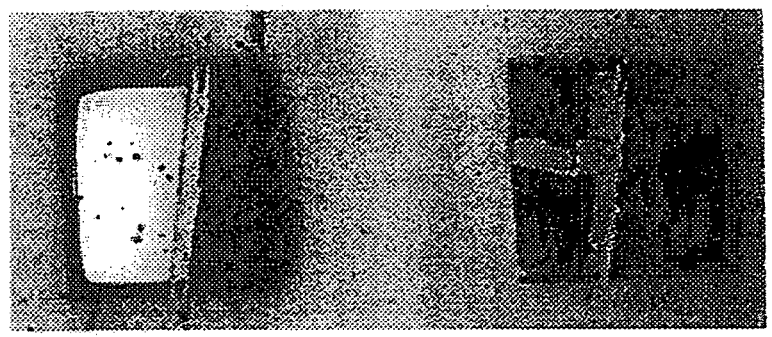
Figure 6C:
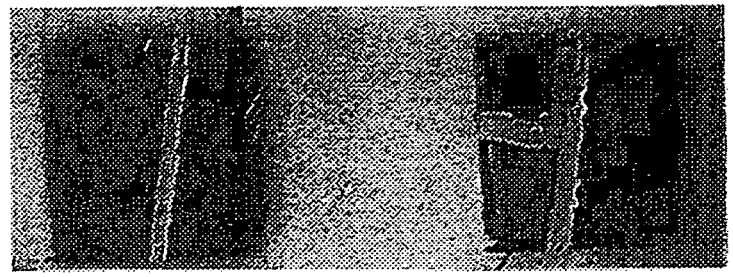

FIG. 6a shows a schematic of the device made on the washed film. The film was prepared as mentioned above, and then metal cathodes were evaporated in the washed areas and in the non-washed areas. These cathodes were thermally evaporated and were patterned by a shadow mask. FIGS. 6b and 6c are pictures of the devices, from below, emitting light. FIG. 6b shows a device emitting green (appears light blue because of camera used) and FIG. 6c shows an emitting blue. The green device is emitting green because the metal cathode was evaporated on top of the dyed film, and the blue device is emitting blue, because the metal cathode was evaporated on top of the washed film.

Figure 7:
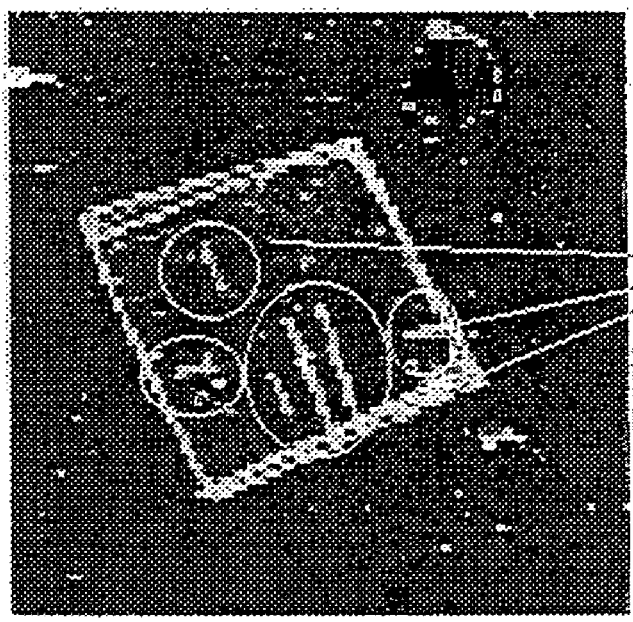
FIG. 7 is a photograph under UV illumination of a device fabricated with an ink jet printer.

Thus, devices can be made by locally dyeing a PVK film, or by locally washing a dyed PVK film. Therefore, the next step is to pattern the dye using an ink-jet printer. FIG. 7 shows a picture of a piece of glass coated with ITO, onto this glass was spun a 1000 angstrom thick film of PVK. Then an Epson Stylus Color 400 ink-jet printer was used to pattern C6 dissolved in acetone on top of the film. The sample was then illuminated under UV. This shows that the dyes can be patterned by an ink-jet printer with a spot diameter of ~500 µm. The next step is to try to determine the ultimate resolution of this technique.

Figure 8A:
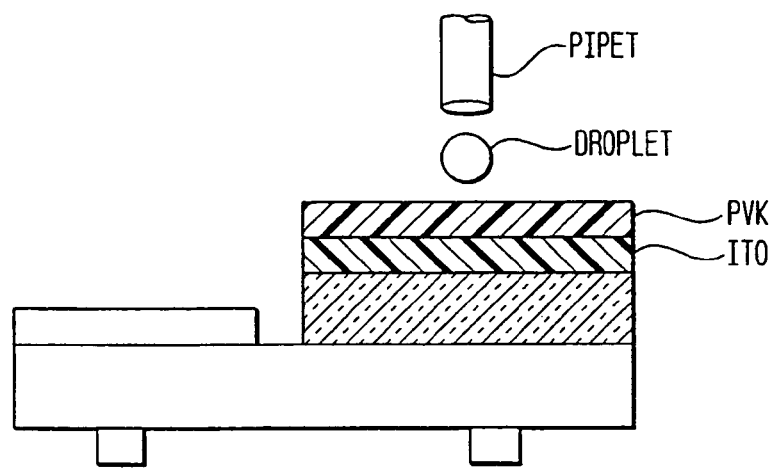
FIG. 8a is an experiment showing the effects of temperature on devices fabricated in accordance with the invention.
Figure 8B:
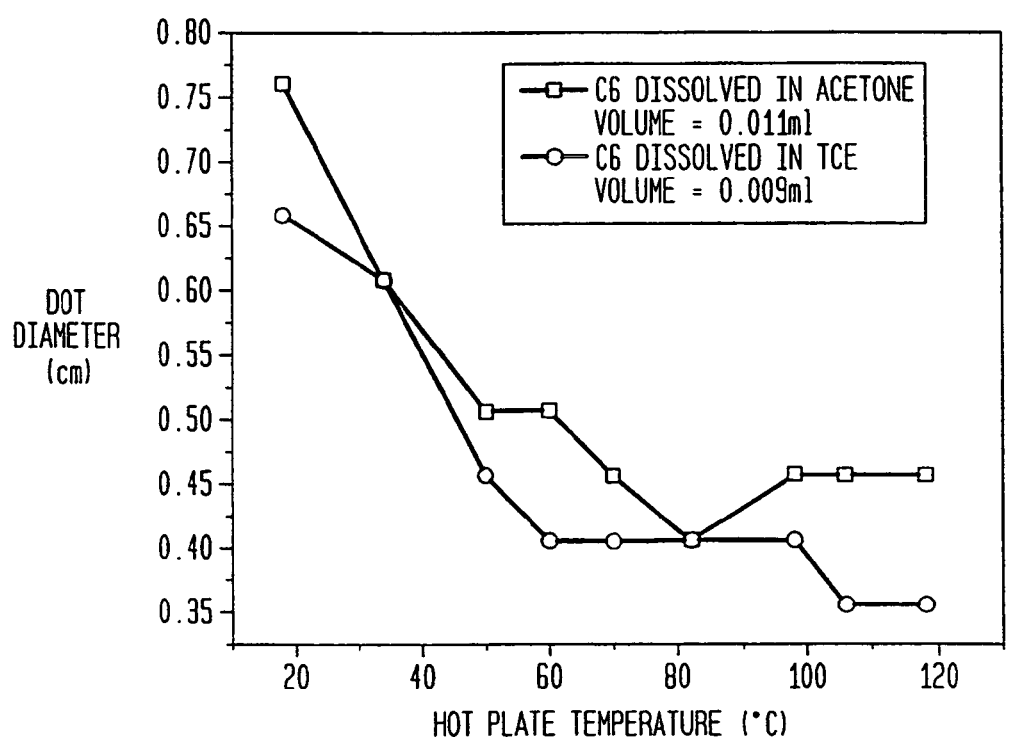
FIG. 8b is plot thereof.

An experiment was done to determine if the diameter of the printed spots could be influenced by temperature. FIG. 8a shows the experimental set-up, a 1000 angstrom film of PVK was spun onto a piece of glass coated with ITO. The sample was then placed onto a hot plate. Droplets of equal volume of C6 dissolved in acetone and equal volumes of C6 dissolved in TCE were dropped on to the PVK film at different temperatures. It was observed that at higher temperatures the spots did not spread as far and therefore had smaller diameters. This is shown in the plot of FIG. 8b. This could potentially make the spot size ~0.6 times smaller. However, this data does not reveal the difference observed in using TCE and acetone.

Figure 9:
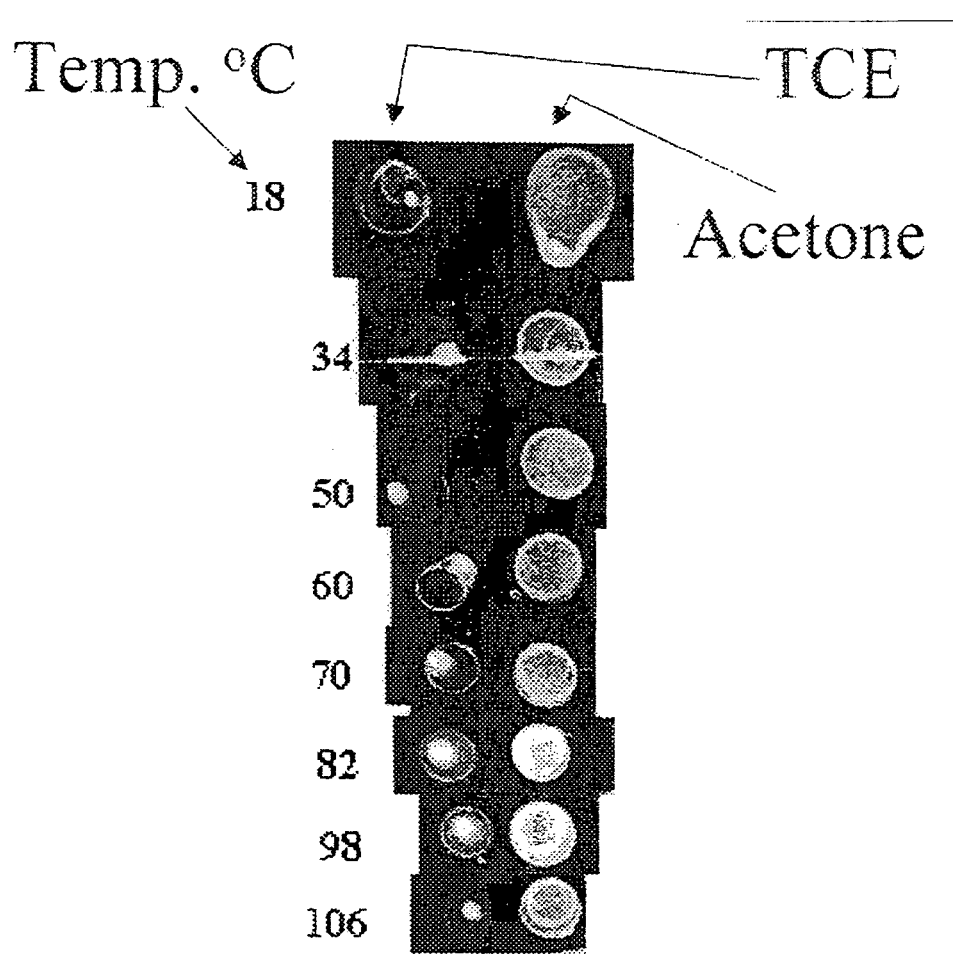
FIG. 9 is a photograph under UV illumination of a device formed in accordance with the invention at increasing temperatures.

FIG. 9 shows a picture of the same spots dropped onto the PVK film at increasing temperatures lit up by a UV lamp. What can be seen is that there are, at higher temperatures in the TCE drops, bright yellow spots which are ~⅓ of the outer spot, and have a more intense luminescence. This may be because, as the solvent dries the C6 tends to stay in the solution and what is left at the end is a highly concentrated small diameter spot. When this spot profile is checked using a surface profilometer it is seen that the dye is actually sitting on the surface. Therefore, in order to take advantage of this small diameter, the substrate would have to be heated further, to allow the dye to thermally diffuse into the film.

In conclusion, PVK can be locally dyed by dissolving dye in acetone or TCE and dropping it on to the surface. Also, this dyed area can be made into a device. A blend film of PVK and C6 can have the C6 locally washed out of it using acetone, and a device can be made using this technique. At the present time ink-jet printed dyed lines can be made with widths of ~500 µm. This width can be further reduced by printing with TCE onto a heated substrate to obtain a spot ⅒ of the diameter of a spot made at room temperature. This substrate would have to then be heated again to thermally diffuse the dye into the film.

Figure 10A:
FIGS. 10a–10c illustrate the steps in introducing film dopants from the top.
Figure 10B:
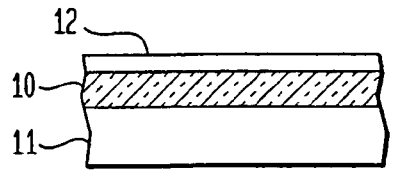
Figure 10C:
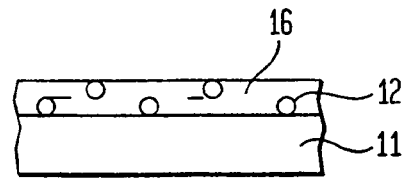

FIGS. 10a–10c illustrate the basic method for introducing film dopants from the top in the fabrication of red, green and blue OLED devices on a common substrate. As shown in FIG. 10a, a uniform film of polymer 10 without the desired dopant is formed on substrate 11. The polymer film 10 may contain other dopants. In FIG. 10b, dopant 12 is placed on the surface of the polymer film 10 by evaporation, spin coating, or other method. In FIG. 10c annealing or other process caused the dopant 12 to enter the film 10 by diffusion or by other methods. The solvents used in spin coating the dopant 12 on the surface may cause dopant 12 to enter polymer 10 and be deposited into it without need for the steps described in FIG. 10c. In this case there is never a solid dopant layer on the surface.

Figure 11A:
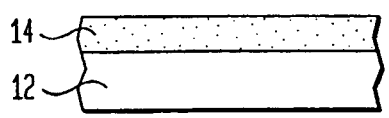
FIGS. 11a–11c illustrate the steps in introducing dopants from the bottom.
Figure 11B:
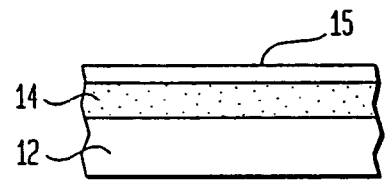
Figure 11C:
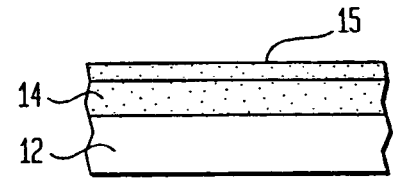

FIGS. 11a–11c show the introduction of dopants into a film from the bottom thereof. In FIG. 11a, a substrate 13 has a coating 14 put down thereon. The coating 14 may contain the desired dopant or, the dopant may be applied in the manner described in FIGS. 10a–10c (i.e. may be polyanaline or similar hole transport layer in OLED). As shown in FIG. 11b, the polymer film 15 is deposited onto the coating 14. In FIG. 11c, annealing causes dopant to partially migrate from layer 14 into polymer film 15. It should be noted that the solvents used in spin coating the top polymer may "leach" dopant out of the underlying layer without the need for the thermal cycling described in FIG. 11c.

Figure 12A:
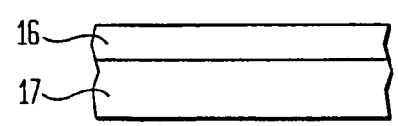
FIGS. 12a–12c illustrates the steps for spatially modifying properties of polymer film.
Figure 12B:
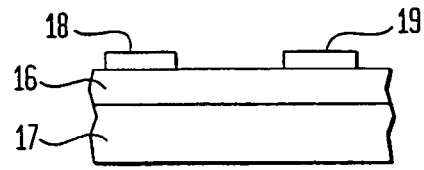
Figure 12C:
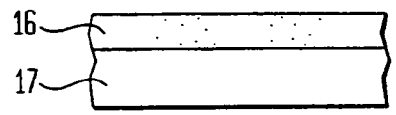

FIGS. 12a–12c show the steps of a method for spatially modifying the properties of the polymer film. FIG. 12a illustrates the deposition of a polymer 16 onto a substrate 17 in the same manner as discussed in connection with FIG. 10a. FIG. 12b shows the creation of local regions of different dopants, 18 and 19 on the polymer surface 16 by local deposition methods such as evaporation through different shadow masks, deposition by screen printing using different screens, or by ink jet printing, or other printing processes using different patterns for each dopant. FIG. 12c illustrates the heat treatment of the structures of FIG. 12b by annealing, for example, to cause the dopant 18 and 19 to migrate into the polymer 16. As discussed in connection with FIGS. 10a–10c, solvents used in screen printing or in ink jet printing may carry dopants directly into the polymer so that the heat treatment step of FIG. 12c may not be required.

This has been demonstrated using dyes C6 (green), C47 (blue), and nile red (green) in acetone solution separately applied to individual regions of a single PVK film, where acetone solution is locally applied by an eyedropper or similar device. Acetone does not cause removal of PVK film, but after evaporation of acetone in a few seconds the fluorescence color of the film under UV excitation has changed.

Figure 13A:
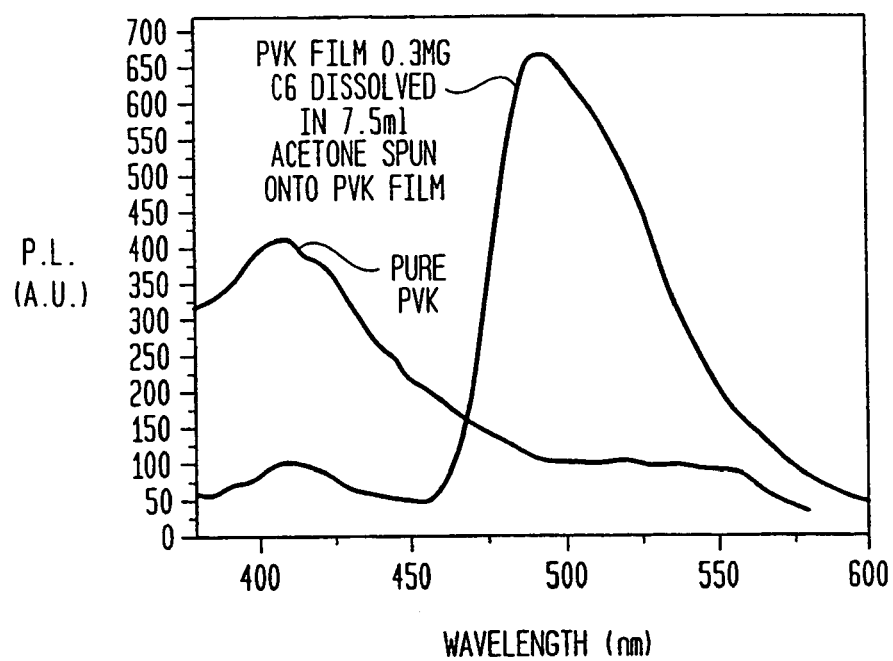
FIGS. 13a–13b illustrate the spectra of PVK and PVK with C6.
Figure 13B:
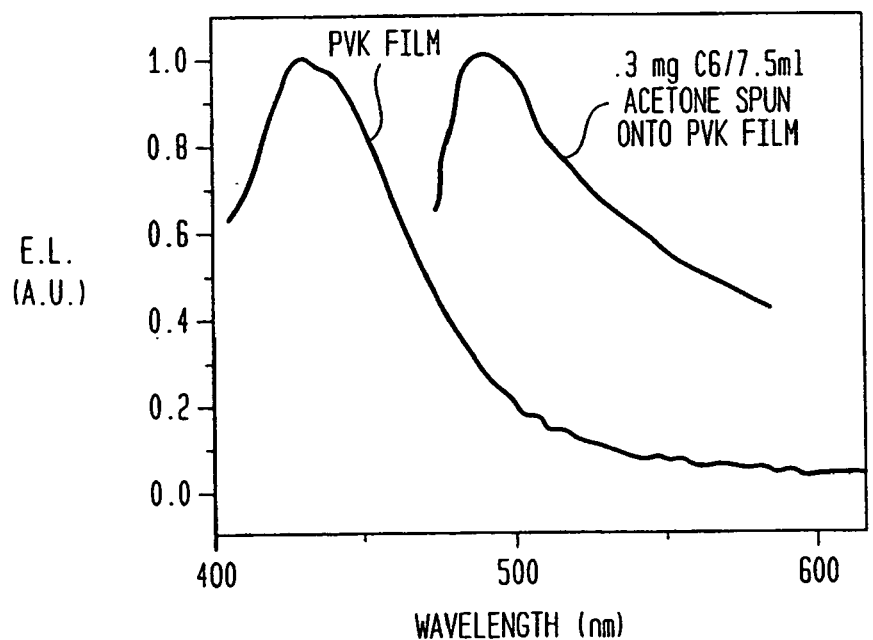

As illustrated in FIGS. 13a–13b, both the photoluminescence (FIG. 13a) and electroluminesence (FIG. 13b) show the shift between pure PVK film and doped PVK.

The dopant need not be pure dopant, but may be co-deposited with another material. Subsequent process (or the very deposition process itself) can then cause dopant to move into underlying layer. Other material may be removed or remove itself (evaporate), or stay behind as separate layer and be part of final structure doped or undoped.

The spatial variations of FIGS. 12a–12c, may be applied to the method described in connection with FIGS. 11a–1c so that patterns of dopant may be introduced into underlying material before top polymer film is deposited.

Figure 14A:
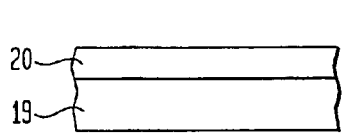
FIGS. 14a–14c illustrate the steps in removing dopant from a polymer film into the underlying layer.
Figure 14B:
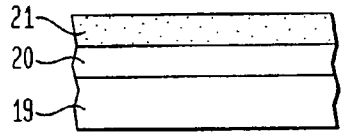
Figure 14C:
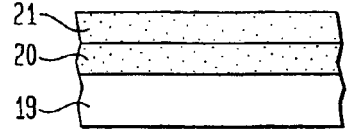

FIGS. 14a–14c illustrate the steps in the removal of dopant from polymer film into an underlying layer. In FIG. 14a, substrate 19 has a bottom absorber film layer 20 deposited thereon. The absorber layer has a low chemical potential for the desired dopant. In FIG. 14b, the doped polymer 21 is deposited onto the absorber layer 20. In FIG. 14c, annealing or another cycle which causes the dopant to move is applied. In lieu of the heating treating, a solvent may be applied which infiltrates (from the top) both the polymer layer 21 and the bottom layer 20 to enable the dopant in the top polymer layer to migrate into the bottom layer 20.

Figure 15A:
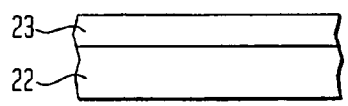
FIGS. 15a–15c illustrate the steps in forming patterned addition of dopant from the top.
Figure 15B:
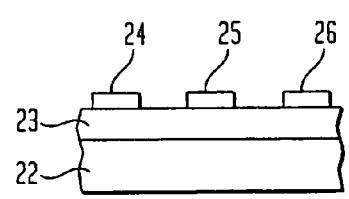
Figure 15C:
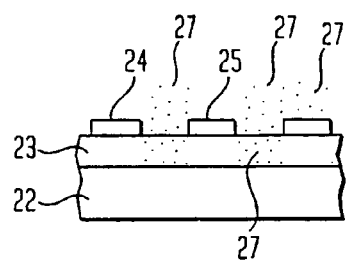
Figure 16A:
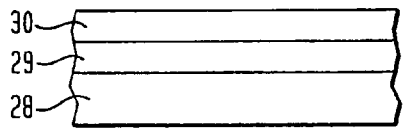
FIGS. 16a–16c illustrate the steps in fabrication of patterned OLEDs.
Figure 16B:
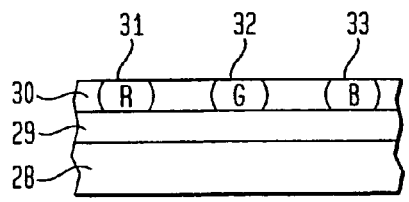
Figure 16C:
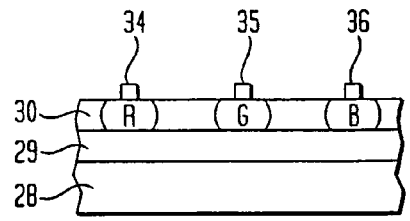

FIGS. 15a–15c shown the patterned addition of dopant from the top with an impermeable barrier. In FIG. 15a, the undoped polymer 23 is deposited on substrate 22. In FIG. 15b, a patterned layer impermeable by the dopant 24, 25, 26 is formed on the top of the polymer 23. In FIG. 15c dopant 27 in ambient is heat treated by annealing. Alternatively, the structure of FIG. 15b may be placed into a solvent containing the dopant FIGS. 16a–16c illustrate the application of the method described in FIG. 12 to the formation of patterned OLEDs of different colors. As shown in FIG. 16a, undoped polymer 30 is deposited everywhere onto ITO layer 29 on glass substrate 28. The ITO may be patterned. Local red (31), green (32) and blue (33) regions are formed by locally doping the polymer 30. These red, green and blue regions may be formed by ink jet printing three different solutions in different regions. Heat treating may then be applied. In FIG. 16c, top contacts 34, 35, 36 are formed on the red, green, and blue regions by standard methods such as by evaporation through a shadow mask. In making OLED's applying color dopant by using localized solvent may change any dopants which were in film from original spin coating (e.g. PBD for electron transport). So, some of this dopant may need to be put in with the color dopant solution.

Figure 17A:
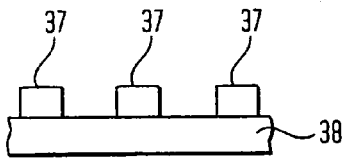
FIGS. 17a–17d illustrate the steps in fabrication of a passive matrix.
Figure 17B:
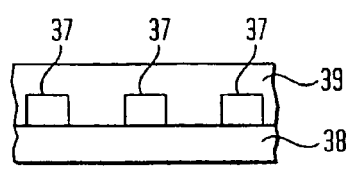
Figure 17C:
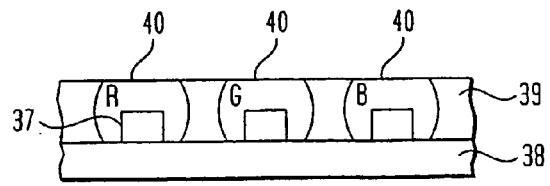
Figure 17D:
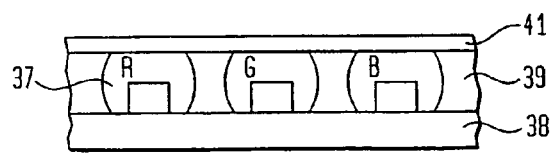

FIGS. 17a–17d illustrate the application of the method described in FIG. 12 to form a passive matrix color OLED display. In FIG. 17a, ITO lines 37 are formed in one direction on glass substrate 38. In FIG. 17b, a uniform polymer film 39 is applied over the ITO lines. In FIG. 17c, red, green, blue doped polymer 40 is formed on the ITO lines in the polymer film as by the steps described in FIG. 16b. FIG. 17d cathode lines 41 as top contacts perpendicular to the bottom contact lines 37. Doping need only be in the region of the intersection of the top and bottom contact lines.

Figure 18A:
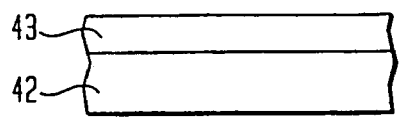
FIGS. 18a–18c illustrate the steps in removal of dopant from polymer film in a pattern to the underlying layer.
Figure 18B:
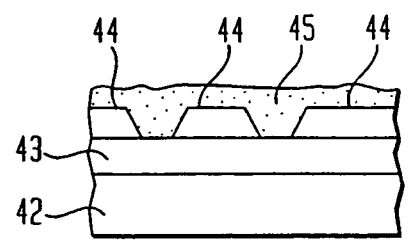
Figure 18C:
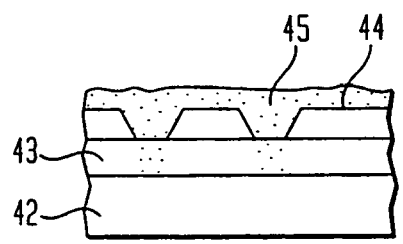

FIGS. 18a–18c illustrate the removal of dopant from polymer film in a pattern to the underlying layer. In FIG. 18a, the absorber film 43 is deposited onto substrate 42. In FIG. 18b, absorber film 43 is patterned or coated with a patterned impervious layer 44. Doped polymer 45 is added onto the layer 44. FIG. 18c shows the effect of annealing or other treatment of the structure of FIG. 18b in causing the doping to move into the underlying layer 43, where it is not impeded by the impervious barrier. The movement of the dopant may be accomplished through the use of a solvent as discussed in connection with FIG. 14c.

Figure 19A:
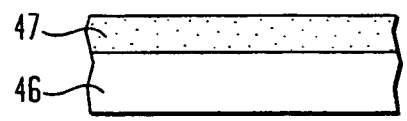
FIGS. 19a–19b illustrate the steps in removal of dopant from the top of a film.
Figure 19B:
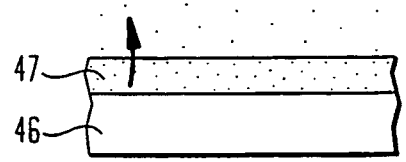

FIGS. 19a–19b shows the removal of dopant from the top of an unpatterned film. In FIG. 19a, doped film 47 is deposited onto a substrate 46 as by spin coating with dopant in solution. FIG. 19b illustrates the treatment of the structure of FIG. 19a by annealing in certain ambients or washing with solvent to the cause the reduction of dopant in layer 47. Washing by applying the drop may not remove the dopant from the film, but cause it to move to the edge of the drop location, leaving little dopant in the center of the drop.

Figure 20A:
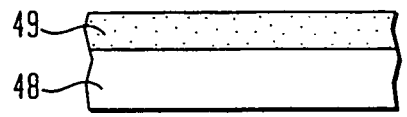
FIGS. 20a–20c illustrate the steps in the patterned removal of dopant from the top of a film.
Figure 20B:
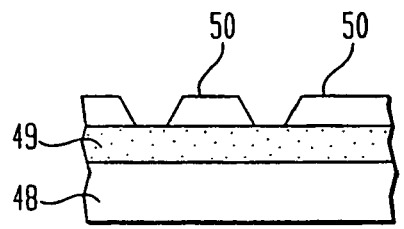
Figure 20C:
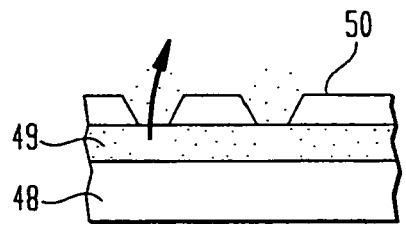

FIGS. 20a–20c illustrate the patterned removal of dopant from the top of the film. In FIG. 20a, doped polymer film 49 is deposited onto substrate 48. In FIG. 20b patterned impermeable layer 50 is applied over the doped polymer layer 49. In FIG. 20c, annealing the structure of FIG. 20b causes dopant to evaporate in areas without barrier 50. This evaporation may also be accomplished by washing with solvent to remove dopant in the areas without barrier 50, or treating with a solvent vapor.

Figure 21A:
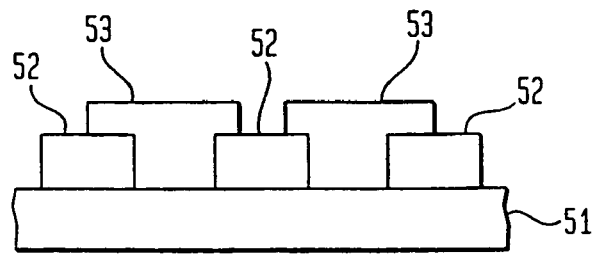
FIGS. 21a–21d illustrate the steps in fabrication of an active matrix OLED display.
Figure 21B:
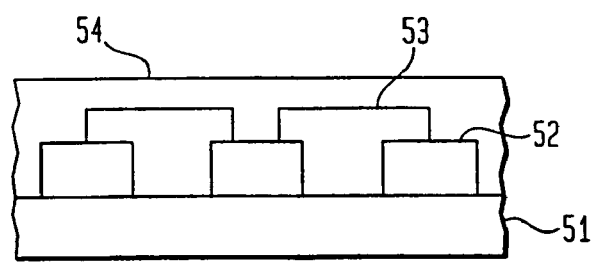
Figure 21C:
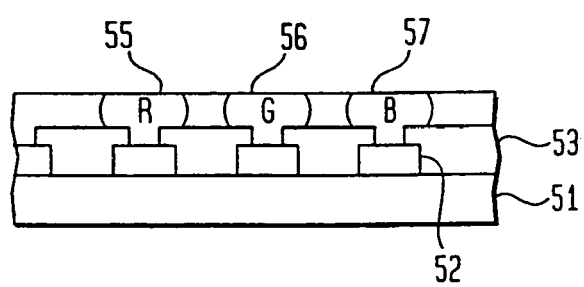
Figure 21D:
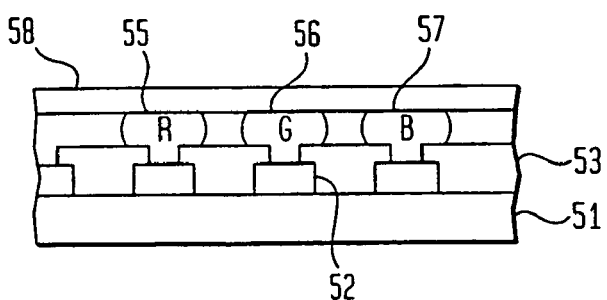

FIGS. 21a–21d show the formation of an active matrix OLED display. In FIG. 21a, glass substrate 51 has patterned insulator 52 and electrodes 53 formed thereon. The electrodes are connect to transistors (not shown) in the pixels. In FIG. 21b, undoped organic layer 54 is deposited everywhere on the structure of FIG. 21a. In FIG. 21c, locally applied red (55), green (56) and blue (57) dopant is applied as by ink jet printing. As shown in FIG. 21d, top electrode 58 is applied without a pattern. Top electrode 58 may be, for example Al:Li or Mg:Ag cathode.

The methods described in this invention may be applied to any organic film, not just polymer based. Solvent methods may cause problems with small organic molecule based films, however, dopants could be deposited by diffusion by thermal treatment by other localized methods such as evaporation through a mask, etc.

It should be further understood that "undoped" means not doped with the dopant being added or removed. Other dopants may be present.

Having thus described the invention in detail, it is to be understood that the foregoing description is not intended to limit the spirit and scope thereof. What is desired to be protected by Letters Patent is set forth in the appended claims.

What is claimed is:

1. A method of manufacturing an organic device comprising:
   providing a substrate,
   providing a first electrode disposed on the substrate;
   applying an organic coating having a dopant over the first electrode;
   removing the dopant from areas of the coating, wherein the areas of the coating from which the dopant is removed remain over the first electrode after the dopant is removed; and
   depositing a second electrode over the organic coating, wherein the dopant is removed from the coating by annealing which causes the dopant to migrate from the coating.

2. The method of claim 1 wherein a mask is patterned on the coating prior to annealing to remove the dopant in a pattern.

3. A method of manufacturing an organic device comprising:
  providing a substrate,
  providing a first electrode disposed on the substrate;
  applying an organic coating having a dopant over the first electrode;
  removing the dopant from areas of the coating, wherein the areas of the coating from which the dopant is removed remain over the first electrode after the dopant is removed; and
  depositing a second electrode over the organic coating,
  wherein the dopant is removed from the coating by a solvent applied to the surface of the coating, and
  wherein a mask is patterned on the coating prior to applying the solvent to remove the dopant in a pattern.

4. A method of manufacturing an organic device comprising:
  providing a substrate,
  providing a first electrode disposed on the substrate;
  applying an organic coating having a dopant over the first electrode;
  removing the dopant from areas of the coating, wherein the areas of the coating from which the dopant is removed remain over the first electrode after the dopant is removed; and
  depositing a second electrode over the organic coating,
  wherein the dopant is removed from the coating by a solvent applied to the surface of the coating, and
  wherein the solvent is applied in a pattern onto the coating to remove the dopant in a pattern that does not include the entire area of the coating.

5. A method of manufacturing, comprising:
  providing a substrate;
  providing a first electrode disposed over the substrate;
  providing a first layer having a dopant disposed over the first electrode;
  providing a second layer on the first layer, wherein the second layer is organic;
  transferring the dopant from the first layer to the second layer; and
  depositing a second electrode over the second layer.

6. The method of claim 5 wherein the dopant is transferred in a pattern from the first layer to the second layer, wherein the pattern does not include the entire area of the second layer.

7. The method of claim 6 wherein masking means is provided on the first layer prior to providing the second layer, and the dopant is transferred from the first layer to the second layer in areas not masked.

8. The method of claim 6 wherein the first layer with the dopant is patterned, and the dopant is transferred to the second layer in the pattern of the first layer.

9. A method of manufacturing a device comprising:
  providing a substrate;
  providing a first electrode disposed over the substrate;
  providing a first layer of material;
  applying a dopant in a pattern to the first layer such that the first layer contains the dopant;
  providing a second layer comprising an organic material disposed over the first electrode;
  transferring the dopant from the first layer to the second layer in the pattern such that the second layer contains the dopant; and
  providing a second electrode disposed over the second layer.

10. The method of claim 9 wherein the dopant is applied by application of liquid droplets.

11. The method of claim 10 wherein the liquid droplets are applied by ink-jet printing.

12. The method of claim 9 wherein the dopant is applied by screen printing.

13. The method of claim 9 wherein the dopant modifies the light emitting properties of the organic film.

14. The method of claim 13 wherein the dopant comprises red, green or blue dyes.

15. The method of claim 14 wherein the dopant includes coumarin and nile red.

16. The method of claim 9 wherein the dopant is transferred by annealing.

* * * * *